(12) United States Patent
Yan et al.

(10) Patent No.: US 11,438,003 B2
(45) Date of Patent: Sep. 6, 2022

(54) ADC SAMPLING DATA IDENTIFICATION METHOD AND SYSTEM, INTEGRATED CIRCUIT AND DECODING DEVICE

(71) Applicant: RIGOL TECHNOLOGIES CO., LTD., Jiangsu (CN)

(72) Inventors: Bo Yan, Suzhou (CN); Chaomin Fang, Suzhou (CN); Yue Wang, Suzhou (CN); Tiejun Wang, Suzhou (CN); Weisen Li, Suzhou (CN)

(73) Assignee: RIGOL TECHNOLOGIES CO., LTD., Jiangsu (CN)

( * ) Notice: Subject to any disclaimer, the term of this patent is extended or adjusted under 35 U.S.C. 154(b) by 0 days.

(21) Appl. No.: 17/280,719

(22) PCT Filed: May 9, 2020

(86) PCT No.: PCT/CN2020/089464
§ 371 (c)(1),
(2) Date: Mar. 26, 2021

(87) PCT Pub. No.: WO2021/128700
PCT Pub. Date: Jul. 1, 2021

(65) Prior Publication Data
US 2022/0123760 A1    Apr. 21, 2022

(30) Foreign Application Priority Data
Dec. 26, 2019   (CN) .......................... 201911366001.7

(51) Int. Cl.
*H03M 1/12* (2006.01)
(52) U.S. Cl.
CPC ......... *H03M 1/1255* (2013.01); *H03M 1/121* (2013.01)

(58) Field of Classification Search
CPC .................................................. H03M 1/1255
(Continued)

(56) References Cited

U.S. PATENT DOCUMENTS

| 10,194,388 B2 | 1/2019 | Rajagopal et al. | |
| 2006/0268939 A1* | 11/2006 | Dries | H04L 49/90 370/498 |
| 2021/0344538 A1* | 11/2021 | Pados | H04B 11/00 |

FOREIGN PATENT DOCUMENTS

| CN | 106105361 A | 11/2016 |
| CN | 108712418 A | 10/2018 |

(Continued)

OTHER PUBLICATIONS

International Search Report dated Sep. 30, 2020 in corresponding parent application PCT/CN2020/089464 (4 pages).
(Continued)

*Primary Examiner* — Peguy Jean Pierre
(74) *Attorney, Agent, or Firm* — Polsinelli PC

(57) ABSTRACT

An ADC sampling data identification method and system, integrated circuit and decoding device are disclosed. The ADC sampling data identification method includes in the integrated circuit, converting sampling data from n time interleaved ADC chips into serial data, generating a preamble sequence, combining the serial data with the generated preamble sequence to obtain new serial data, sending the new serial data to a decoding device, generating a clock signal that matches the new serial data, and sending the clock signal to the decoding device; and in the decoding device, receiving the new serial data and the clock signal from the ADC integrated circuit, obtaining the preamble sequence for combining according to an agreement with the ADC integrated circuit, and identifying a start position of the sampling data from the time interleaved ADC chips.

14 Claims, 5 Drawing Sheets

(58) Field of Classification Search
USPC .......................................... 341/155, 159, 126
See application file for complete search history.

(56) References Cited

FOREIGN PATENT DOCUMENTS

| | | |
|---|---|---|
| CN | 108880686 A | 11/2018 |
| CN | 109688080 A | 4/2019 |
| CN | 110289859 A | 9/2019 |
| CN | 108407736 B | 12/2019 |
| CN | 111106834 A | 5/2020 |
| EP | 1 401 105 A1 | 3/2004 |
| JP | 2001-345706 A | 12/2001 |

OTHER PUBLICATIONS

Written Opinion dated Sep. 30, 2020 in corresponding parent application PCT/CN2020/089464 (5 pages).
Search document issued in corresponding Chinese Patent Application No. 201911366001.7 (3 pages).
Chinese Office Action dated Oct. 10, 2020 issued in corresponding Patent Application No. 201911366001.7 (11 pages).
European Search Report dated Jun. 14, 2022 issued in corresponding Patent Application No. 20859670.0 (11 pages).

* cited by examiner

ADC SAMPLING DATA IDENTIFICATION METHOD AND SYSTEM, INTEGRATED CIRCUIT AND DECODING DEVICE

CROSS REFERENCE TO RELATED APPLICATIONS

This application is a National Stage Application of PCT International Application PCT/CN2020/089464, filed on May 9, 2020 which claims priority to Chinese Patent Application No. 201911366001.7, entitled "An ADC sampling data identification method and system, integrated circuit and decoding device", filed before the China National Intellectual Property Administration on Dec. 26, 2019, both of which are incorporated herein by reference in their entireties.

TECHNICAL FIELD

The present disclosure relates to the field of high speed data acquisition, and in particular to an ADC sampling data identification method and system, integrated circuit and decoding device.

BACKGROUND

With the development of technology and engineering applications, a sampling rate required by a data acquisition system become higher and higher. Since a sampling rate of an existing single-core ADC is limited, alternating time parallel sampling technology (time interleaved ADC) has become a best effective technological way for implementing a data acquisition system with a higher sampling rate. An application process of time interleaved ADCs involves technologies for sampling aperture error calibration, signal gain error calibration, offset error calibration to be multi-core ADCs and etc. Implementations of these technologies are all related to sampling data based digital post-processing technology, and a start position of sampling data among time interleaved ADCs and a synchronization status of each ADC must be exactly known in advance.

In a prior art, the synchronization of time interleaved ADC sampling data mainly includes firstly causing the ADCs to stop to sample, outputting a fixed test pattern, and then causing a back-end device to detect and process the output pattern. After the time interleaved ADCs have been synchronized in a test mode, the ADCs are switched to a normal operation mode to be used directly.

The above method for implementing time interleaved ADC sampling data synchronization has problems as follows: 1) After each time interleaved ADC has been switched from a test mode to a normal operation mode, it is unable to determine a start position of effective data from the ADCs, which will make it inconvenient to determine a sampling data combination sequence between ADCs; 2) Once an ADC that has been synchronized in a test mode is switched to a normal operation mode, a synchronization error would be introduced. In addition, after the ADC has been switched to a normal mode, it is impossible to obtain a synchronization status of the ADC by observing the data outputted from it. As a result, it is difficult to find a difference in synchronization status between ADCs at this time.

SUMMARY

The object of the present disclosure is to solve the following problem: in alternating time parallel sampling technology, it is impossible to identify a start position of sampling data and a synchronization status among time interleaved ADCs within a high speed data acquisition system.

In order to solve the above technical problem, a first aspect of the present disclosure provides an ADC sampling data identification method, which is applicable to an ADC integrated circuit and comprises:
converting sampling data from n time interleaved ADC chips into serial data;
generating a preamble sequence;
combining the serial data with the generated preamble sequence to obtain new serial data, and sending the new serial data to a decoding device;
generating a clock signal that matches the new serial data, and sending the clock signal to the decoding device for the decoding device to identify the sampling data according to the new serial data and the clock signal.

The second aspect of the present disclosure provides an ADC sampling data identification method, wherein the ADC sampling data identification method is applicable to a decoding device and comprises:
receiving new serial data and a clock signal from an ADC integrated circuit, wherein the new serial data is composed of serial data and a preamble sequence, and wherein the serial data is converted from sampling data from n time interleaved ADC chips, and the clock signal matches the new serial data;
obtaining the preamble sequence for combining according to an agreement with the ADC integrated circuit;
identifying a start position of the sampling data from the time interleaved ADC chips according to the new serial data, the clock signal and the preamble sequence for combining.

The third aspect of the present disclosure provides an ADC integrated circuit comprising n time interleaved ADC chips and further comprising:
a parallel-serial conversion module which is configured to convert sampling data from the n time interleaved ADC chips into serial data;
a preamble generating module which is configured to generate a preamble sequence;
a combination module which is configured to combine the serial data with the generated preamble sequence to obtain new serial data, and send the new serial data to a decoding device;
a matching clock generating module which is configured to generate a clock signal that matches the new serial data, and send the clock signal to the decoding device for the decoding device to identify the sampling data according to the new serial data and the clock signal.

A fourth aspect of the present disclosure provides a decoding device comprising:
a communication module which is configured to receive new serial data and a clock signal from an ADC integrated circuit, wherein the new serial data is composed of serial data and a preamble sequence, and wherein the serial data is converted from sampling data from n time interleaved ADC chips, and the clock signal matches the new serial data;
a preamble module which is configured to obtain the preamble sequence for combining according to an agreement with the ADC integrated circuit;
a start position identification module which is configured to identify a start position of the sampling data from the time interleaved ADC chips according to the new serial data, the clock signal and the preamble sequence for combining.

The fifth aspect of the present disclosure provides a time interleaved ADC sampling data identification system comprising an ADC integrated circuit and a decoding device;

wherein the ADC integrated circuit includes: n time interleaved ADC chips; a parallel-serial conversion module which is configured to convert sampling data from the n time interleaved ADC chips into serial data; a preamble generating module which is configured to generate a preamble sequence; a combination module which is configured to combine the serial data with the generated preamble sequence to obtain new serial data, and send the new serial data to a decoding device; a matching clock generating module which is configured to generate a clock signal that matches the new serial data, and send the clock signal to the decoding device;

the decoding device includes: a communication module which is configured to receive new serial data and a clock signal from an ADC integrated circuit, wherein the new serial data is composed of serial data and a preamble sequence, and wherein the serial data is converted from sampling data from n time interleaved ADC chips, and the clock signal matches the new serial data; a preamble module which is configured to obtain the preamble sequence for combining according to an agreement with the ADC integrated circuit; a start position identification module which is configured to identify a start position of the sampling data from the time interleaved ADC chips according to the new serial data, the clock signal and the preamble sequence for combining.

The ADC sampling data identification method and system, integrated circuit and decoding device provided by the present disclosure can determine a start position of the sampling data and the synchronization status of the time interleaved ADC chips without changing the operation mode of each time interleaved ADC chip. The present disclosure eliminates the need of a process to switch each time interleaved ADC chip to a test mode when it is synchronized and to switch it back to a normal mode after the synchronization has been completed, simplifies the steps of synchronization and post calibration, and eliminates the synchronization error and data jitter of the ADCs in different operation modes due to the process of synchronization and post calibration. In addition, by adopting the technical solution of the present disclosure, the synchronization status of each channel can be detected in real time after each reset of the ADCs, thereby ensuring the real time synchronization required by the time interleaving of n ADCs.

In order to make the above and other objectives, features, and advantages of the present application more obvious and understandable, preferred embodiments are provided and described in detail in connection with the accompanying drawings.

BRIEF DESCRIPTION OF THE DRAWINGS

In order to describe the technical solutions in the embodiments of the present disclosure more clearly, drawings required to be used in the descriptions of the embodiments will be introduced briefly. It is obvious that the drawings in the descriptions below are merely some of the embodiments of the present disclosure. Those skilled in the art can obtain additional drawings based on these drawings without creative efforts.

DETAILED DESCRIPTION

In order to make the technical features and effects of the present disclosure more obvious, the technical solutions of the present disclosure will be further illustrated in combination with accompanying drawings. The present disclosure may also be illustrated or implemented with other different specific examples. Any equivalent transformations made by those skilled in the art within the scope of the claims belong to the protection category of the present disclosure.

In the description of this specification, descriptions of reference terms "an embodiment", "a specific embodiment", "some implementations", "for example" and etc. mean that the specific features, structures, or characteristics that are described in connection with the embodiment or example are included in at least one of the embodiments or examples of this application. In this specification, the schematic representations of the above terms do not necessarily refer to a same embodiment or example. Moreover, the described specific features, structures or characteristics can be combined into any one or more embodiments or examples in a proper manner. The order of steps referred in each embodiment is used to schematically illustrate the implementation of the present application, and the order of the steps is not limited and can be appropriately adjusted as needed.

Figure 1:
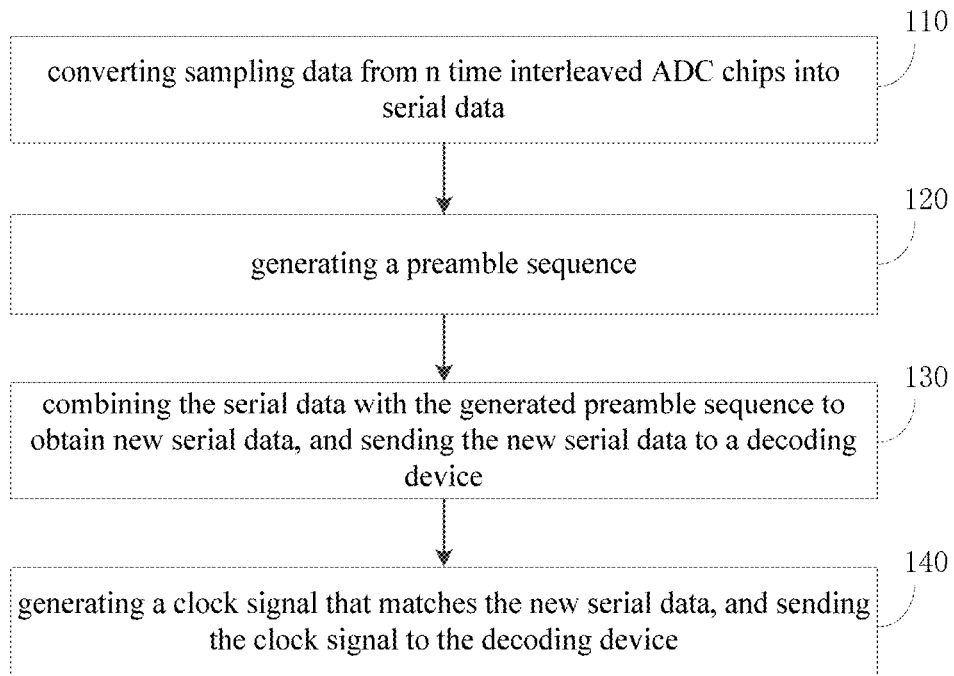
FIG. 1 shows a flowchart of an ADC sampling data identification method at an ADC integrated circuit side according to an embodiment of the present disclosure.

It is impossible for the existing time interleaved ADC sampling data synchronization methods to determine an effective data start position and synchronization status of the ADCs. In view of this, in an embodiment of the present disclosure, an ADC sampling data identification method is provided, which is applicable to an ADC integrated circuit. As shown in FIG. 1, the method comprises steps 110-140.

In step 110, sampling data from n time interleaved ADC chips is converted into serial data.

In implementation, this step can be implemented by an existing parallel-serial converter, and the specific implementation process of this step is not limited in this disclosure.

In step 120, a preamble sequence is generated. In some implementations, patterns of the preamble sequence include, but are not limited to, one or more of AB code, nAnB code (n is greater than or equal to 1, which can be equal to the number of the time interleaved ADC chips), ramp function code and pseudo-random code.

In implementation, step 110 can be performed before or after step 120, or can be performed synchronously with step 120 and a same clock signal is used. In order to facilitate the generation of the preamble sequence, the length of the generated preamble sequence (that is, the number of preamble codes in the preamble sequence) is not limited in this step. For example, the ramp function code may be generated by a multi-bit counter with infinite loop outputs, or the ramp function code can invoke a sequence code that is pre-stored in a memory. Different methods can be selected dependent on different application scenarios. Pseudo-random code can be shifted indefinitely with a shift register. As to nAnB code, firstly specific contents of A code pattern and B code pattern are required to be defined by a user according to the number of the ADC chips. For example, 14 bits are used to represent a data unit, and contents of the A code pattern and B code pattern can be any one of 0~16383; then, a corresponding code pattern is output according to the operation mode (4A4B mode or 2A2B mode). Specifically, the nAnB code can be implemented with a counter and a data selector. The counter can use a clock with a same cycle as the data stream. If A and B are output alternately every two clock cycles, then the nAnB code is of 2A2B code pattern, and if A and B are output alternately every four clock cycles, then the nAnB code is of 4A4B code pattern. The nAnB code can also be implemented with a single-chip microcomputer. Firstly the data for producing 4A4B or 2A2B through expansion is stored in the single-chip microcomputer, and then the code pattern is directly output according to the clock cycle of the data stream.

In some implementations, to facilitate detection, a ramp function code may be used for detecting a start position of the sampling data, and a nAnB code may be used for detecting a synchronization status of the sampling data.

In step 130, the serial data is combined with the generated preamble sequence to obtain new serial data, and the new serial data is sent to a decoding device.

In some implementations, the step 130 includes the following steps.

In case that the number of preambles in the preamble sequence is not defined when the preamble sequence is generated, the preambles in the preamble sequence is intercepted by a predetermined number; the intercepted preambles is added before the serial data or a corresponding number of serial data is replaced with the intercepted preambles to obtain new serial data.

In implementation, the above step can be implemented in a manner as follows: firstly, the preamble sequence is output, and when the number of the outputted preambles reaches a predetermined number, the serial data is outputted instead. For example, the predetermined number of preambles is 64. When this step is implemented, the preamble sequence is firstly output, and the number of the outputted preambles is recorded. After the number of the outputted preambles reaches 64, the serial data is outputted instead.

This implementation can reduce limitations on a preamble sequence generating device.

In another implementation, the step 130 includes the following steps.

In case that the number of the preambles in the preamble sequence is defined when the preamble sequence is generated, the generated preamble sequence is added before the serial data or the serial data is replaced with the generated preamble sequence to obtain the new serial data, or each time a preamble is generated, the generated preamble is added before the serial data or the serial data is replaced with the generated preamble until a predetermined number of preambles are generated.

This implementation can reduce the power consumption of the preamble sequence generating device.

In step 140, a clock signal that matches the new serial data is generated, and the clock signal is sent to the decoding device for the decoding device to identify the sampling data according to the new serial data and the clock signal. The combination process changes the start position and end position of the data, which results in a change in a data stable time interval. As a result, the clock rising edge that can fall into the serial data stable interval at first may just fall at the transition position of the new serial data. This step is just able to adjust the ADC data stable time interval changed due to the combination process, thus enabling the decoding device to correctly read data according to the clock signal generated at this step.

In some implementations, the clock signal can be obtained by dividing the frequency of an external input clock and adding a delay buffer. For example, the data can be read by using the rising edges and falling edges of the clock signal. That is, the frequency of the clock is half the frequency of the data (usually the timing of a DDR memory). Thus, the clock can be obtained by dividing the frequency of the external input clock by two. Before dividing the frequency, the clock also need to ensure its phase relationship with the data clock through a certain number of Buffers.

In other implementation, in order to support a general decoding device and facilitate decoding, the rising edges and falling edges of the clock signal are aligned with centers of data units of the new serial data.

Figure 2:
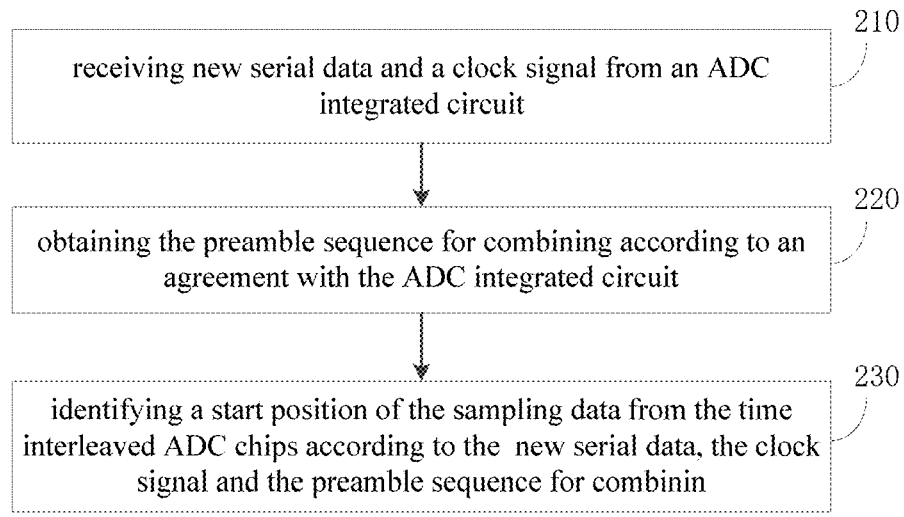
FIG. 2 shows a flowchart of an ADC sampling data identification method at a decoding device side according to an embodiment of the present disclosure.

Correspondingly, in an embodiment of the present disclosure, an ADC sampling data identification method applicable to the decoding device is provided, which is used in conjunction with FIG. 1. As shown in FIG. 2, the ADC sampling data identification method comprises steps 210-230.

In step 210, new serial data and a clock signal are received from an ADC integrated circuit, in which the new serial data is composed of serial data and a preamble sequence, where the serial data is converted from sampling data from n time interleaved ADC chips, and the clock signal matches the new serial data.

In step 220, the preamble sequence for combining is obtained according to an agreement with the ADC integrated circuit.

In step 230, a start position of the sampling data from the time interleaved ADC chips is identified according to the new serial data, the clock signal, and the preamble sequence for combining.

Specifically, the step 230 includes the following steps.

The clock signal is used to parse the new serial data;

Parsed data units are compared with data units contained in the preamble sequence for combining, and in case that the parsed data units are identical to the data units contained in the preamble sequence for combining, next parsed data units is determined to be the start position of the sampling data from the time interleaved ADC chips.

Figure 3:
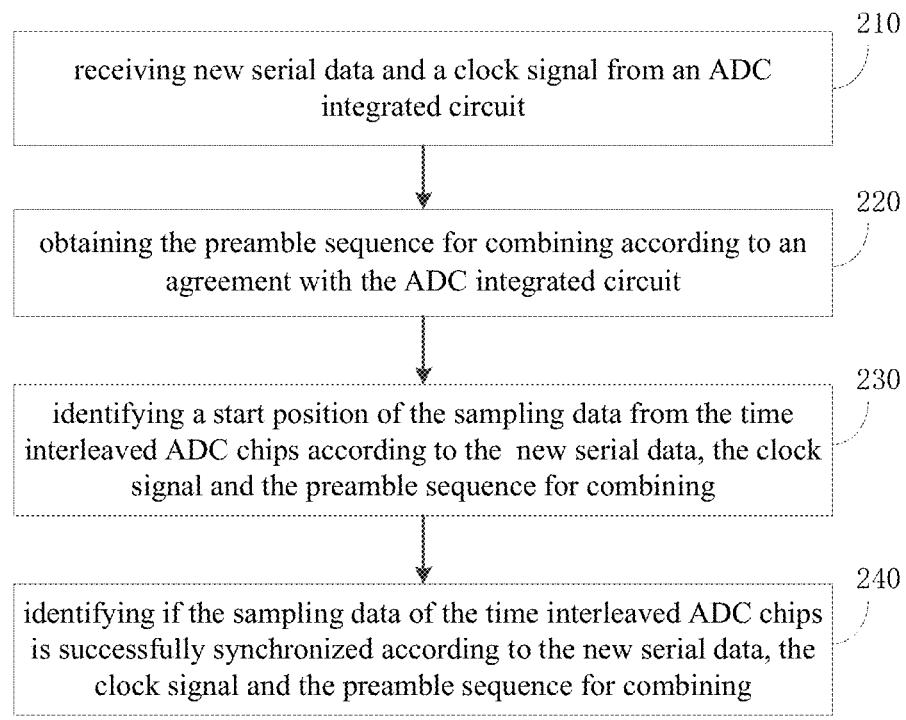
FIG. 3 shows a flowchart of a ADC sampling data identification method at a decoding device side according to another embodiment of the present disclosure.

In a further embodiment of the present disclosure, as shown in FIG. 3, the ADC sampling data identification method applicable to the decoding device further includes step 240.

In step 240, it is identified if the sampling data of the time interleaved ADC chips is successfully synchronized according to the new serial data, the clock signal and the preamble sequence for combining.

Specifically, the step 240 includes the following step.

The clock signal is used to parse the new serial data;

The parsed new serial data is converted into n channels of parallel data;

It is determined if the first m data units in each data channel meet a predetermined relationship with the preamble sequence for combining. If so, the data from the ADCs is successfully synchronized, where $$m £ \frac{N}{n},$$

N is the number of data units contained in the preamble sequence. Herein, the predetermined relationship is related to the code pattern of the preamble sequence for combining and the channel number of the parallel data, and the predetermined relationship is not specifically limited in this disclosure.

By employing the ADC sampling data identification methods provided in FIG. 1, FIG. 2 and FIG. 3 in cooperation with each other, the following technical effects can be achieved.

1) The start position of the sampling data and the synchronization statuses of the time interleaved ADC chips can be determined without changing the operation mode of each time interleaved ADC chip;

2) The need of a process to switch each time interleaved ADC chip to a test mode when it is synchronized and to switch it back to a normal mode after the synchronization has been completed can be eliminated, the steps of synchronization and post calibration can be simplified, and the synchronization error and data jitter of the ADCs in different operation modes due to the process of synchronization and post calibration can be eliminated;

3) The synchronization status of each channel can be detected in real time after each reset of the ADCs, thereby ensuring the real time synchronization required by the time interleaving of the n ADCs.

Under the same inventive concept, the embodiments of the present application further provide an ADC integrated circuit and a decoding device, as described in the embodiments below. Since the principles of the ADC integrated circuit and the decoding device for solving the problems are similar to that of the above-mentioned method, for the implementations of the ADC integrated circuit and the decoding device, reference can be made to the implementation of this method, and repeated descriptions are omitted here.

Figure 4:
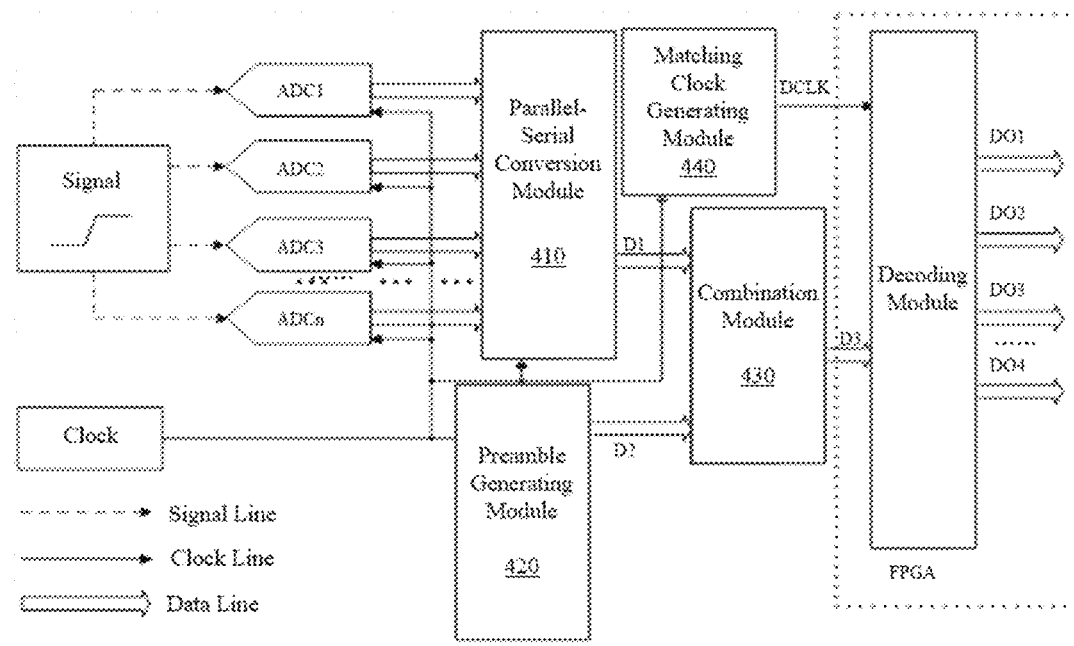
FIG. 4 shows a block diagram of an ADC integrated circuit according to an embodiment of the present disclosure.

As shown in FIG. 4, where an ADC integrated circuit according to an embodiment of the present disclosure is shown, the ADC integrated circuit includes n time interleaved ADC chips, and further includes a parallel-serial conversion module 410, a preamble generating module 420, a combination module 430 and a matching clock generating module 440.

The parallel-serial conversion module 410 is configured to convert sampling data from the n time interleaved ADC chips into serial data. The frequency of the converted serial data is n times of the frequency of the data from the ADC chips. For example, if there are 4 time interleaved ADC chips, the cycle of the converted serial data stream is ¼ of the original clock cycle. The parallel-serial conversion module sequentially outputs data for transaction of the ADC chips in one original clock cycle.

The preamble generating module 420 is configured to generate a preamble sequence. The code pattern of the preamble sequence includes one of AB code, ramp function code and random code.

The combination module 430 is configured to combine the serial data with the generated preamble sequence to obtain new serial data, and send the new serial data to a decoding device for the decoding device to identify the sampling data according to the new serial data and the clock signal.

In some implementations, the combination module 430 combining the serial data with the generated preamble sequence to obtain new serial data includes: in case that the number of preambles in the preamble sequence is not defined when the preamble sequence is generated, preambles in the preamble sequence is intercepted by a predetermined number; the intercepted preambles is added before the serial data or a corresponding number of serial data is replaced with the intercepted preambles to obtain the new serial data. In implementation, the above step can be implemented in a manner as follows: firstly, the preamble sequence is outputted, and when the number of the outputted preambles reaches a predetermined number of preambles, the serial data is outputted instead. For example, the predetermined number of preambles is 64. When this step is implemented, the preamble sequence is firstly outputted, and the number of the outputted preambles is recorded. After the number of the outputted preambles reaches 64, the serial data is outputted instead.

In other embodiments, the combination module 430 combining the serial data with the generated preamble sequence to obtain new serial data includes: In case that the number of preambles in the preamble sequence is defined when the preamble sequence is generated, the generated preamble sequence is added before the serial data or the serial data is replaced with the generated preamble sequence to obtain the new serial data, or each time a preamble is generated, the generated preamble is added before the serial data or the serial data is replaced with the generated preamble until a predetermined number of preambles are generated.

The matching clock generating module 440 is configured to generate a clock signal that matches the new serial data, and send the clock signal to the decoding device. In some implementations, in order to support a general decoding device and facilitate decoding, the clock signal generated by the matching clock generating module is a clock signal of DDR type (i.e., the frequency of the clock is half of the frequency of the data). The rising edges and falling edges of the clock are aligned with centers of data units of the new serial data.

Figure 5:
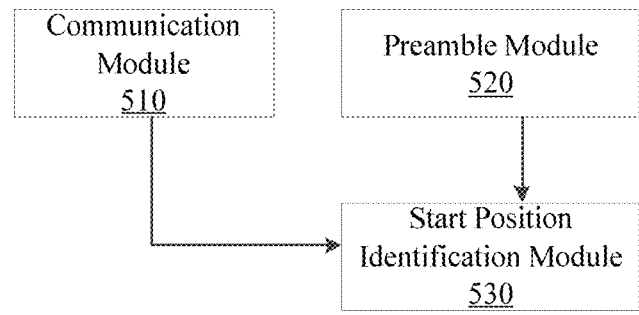
FIG. 5 shows a block diagram of a decoding device according to an embodiment of the present disclosure.

FIG. 5 shows a decoding device according to an embodiment of the present disclosure. As shown in FIG. 5, the decoding device includes a communication module 510, a preamble module 520 and a start position identification module 530.

The communication module 510 is configured to receive new serial data and a clock signal sent by the ADC integrated circuit, in which the new serial data is composed of serial data and a preamble sequence. The serial data is converted from sampling data from n time interleaved ADC chips, and the clock signal matches the new serial data.

The preamble module 520 is configured to obtain the preamble sequence for combining according to an agreement with the ADC integrated circuit.

The start position identification module 530 is configured to identify a start position of the sampling data from the time interleaved ADC chips according to the new serial data, the clock signal, and the preamble sequence for combining.

The decoding device of this embodiment can be implemented by FPGA or DSP. In a specific embodiment, the start position identification module 530 identifying a start position of the sampling data from the time interleaved ADC chips according to the new serial data, the clock signal, and the preamble sequence for combining includes the following steps. The clock signal is used to parse the new serial data; Parsed data units are compared with data units contained in the preamble sequence for combining, and in case that the parsed data units are identical to the data units contained in the preamble sequence for combining, it is determined that next parsed data unit is the start position of the sampling data from the time interleaved ADC chips. Specifically, parsing the new serial data with the clock signal includes: the clock signal is used to parse the new serial data, and data units are captured by a flip-flop according to a beat of the clock signal.

Figure 6:
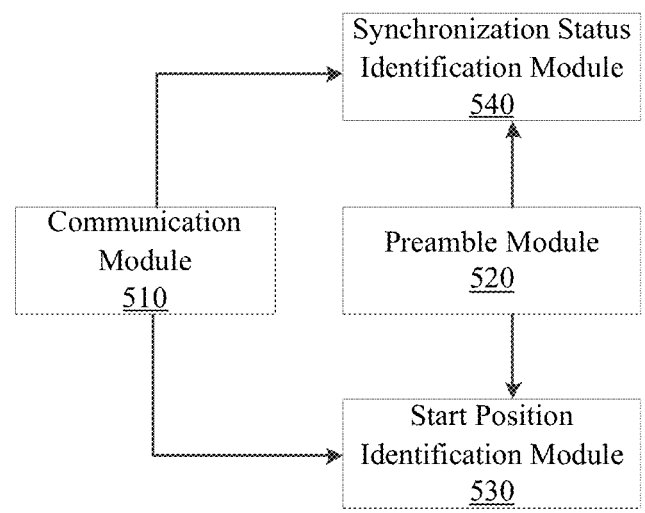
FIG. 6 shows a block diagram of a decoding device according to another embodiment of the present disclosure.

FIG. 6 shows a decoding device according to another embodiment of the present disclosure. As shown in FIG. 6, in this embodiment, in addition to the above mentioned communication module 510, preamble module 520 and start position identification module 530, the decoding device further includes a synchronization status identification module 540.

The synchronization status identification module 540 is configured to identify if the sampling data of the time interleaved ADC chips is successfully synchronized according to the new serial data, the clock signal and the preamble sequence for combining.

In a specific embodiment, the synchronization status identification module 540 identifying if the sampling data of the time-interleaved ADC chips is successfully synchronized according to the new serial data, the clock signal, and the preamble sequence for combining includes: The clock signal is used to parse the new serial data; The parsed new serial data is converted into n channels of parallel data; It is determined if the first m data units parsed from each data channel meets a predetermined relationship with the preamble sequence; If so, the data from the ADCs is successful synchronized, where $$m £ \frac{N}{n},$$

and N is the number of data units contained in the preamble sequence.

The following technical effects can be achieved by the ADC integrated circuit provided in the present disclosure in cooperation with the decoding device.

1) The start position of the sampling data and the synchronization statuses of the time interleaved ADC chips can be determined without changing the operation mode of each time interleaved ADC chip;

2) The need of a process to switch each time interleaved ADC chip to a test mode when it is synchronized and to switch it back to a normal mode after the synchronization has been completed can be eliminated, the steps of synchronization and post calibration can be simplified, and the synchronization error and data jitter of the ADCs in different operation modes due to the process of synchronization and post calibration can be eliminated;

3) The synchronization status of each channel can be detected in real time after each reset of the ADCs, thereby ensuring the real time synchronization required by the time interleaving of n ADCs.

Figure 7:
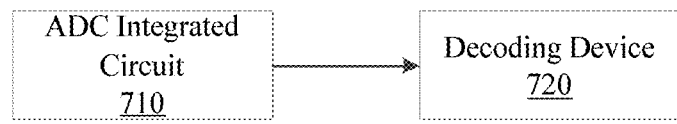
FIG. 7 shows a block diagram of an ADC sampling data identification system according to an embodiment of the present disclosure.

FIG. 7 shows a time interleaved ADC sampling data identification system according to an embodiment of the present disclosure. As shown in FIG. 7, the time interleaved ADC sampling data identification system includes: an ADC integrated circuit 710 according to any of the foregoing embodiments and a decoding device 720 according to any of the foregoing embodiments. For the implementation process of the ADC integrated circuit 710 and the decoding device 720, reference may be made to the foregoing embodiments, and detailed descriptions of it will not be provided herein.

Figure 8:
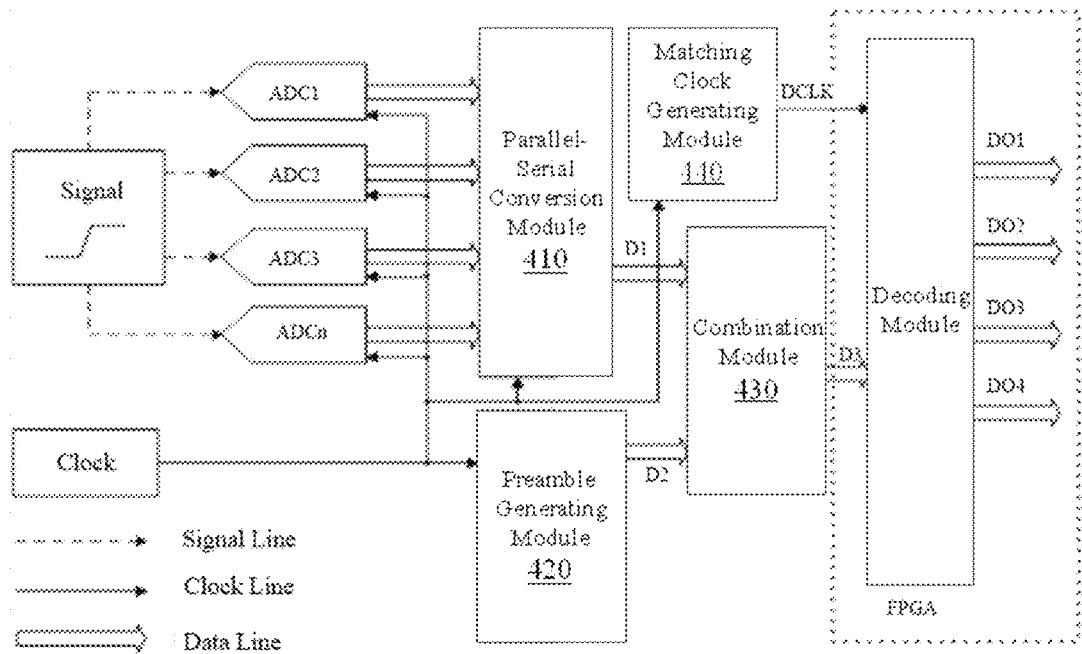
FIG. 8 shows a block diagram of a 4-channel time interleaved ADC sampling data identification system according to a specific embodiment of the present disclosure.

In order to explain the technical solution of the present disclosure more clearly, the 4 channel time interleaved ADC sampling data identification system as shown in FIG. 8 is taken as an example to illustrate how to identify the start position of the ADC data and the synchronization status.

Specific Embodiment One

Figure 9:
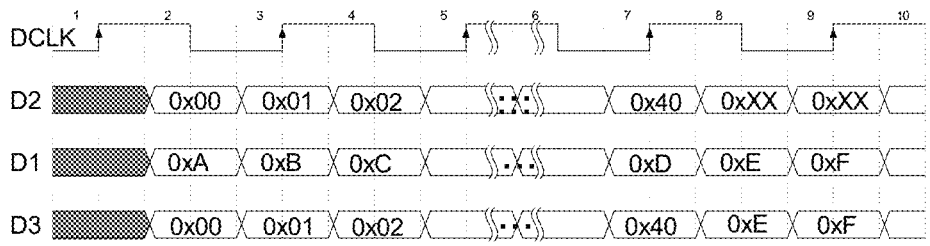
FIG. 9 shows a transmission timing chart of ADC sampling data according to a specific embodiment of the present disclosure.

FIG. 9 is a transmission timing relationship chart of ADC alternating time parallel sampling data having 64 ramp function code patterns as preambles. As shown in FIG. 9, the timing relationship chart can explain how the present disclosure determining a start position of data from the time interleaved ADCs.

It can be seen from FIG. 8 that a sequence of the input signal D3 is required to be identified during the decoding process of the decoding device. It is assumed that, according to an agreement, the preamble sequence has 64 data units. As shown in FIG. 9, after the 0~63th data units of the preamble sequence has been parsed, the next data unit, that is the 64th data unit (for example, 0xE) would be the start position of the ADC data.

Specific Embodiment Two

Figure 10:
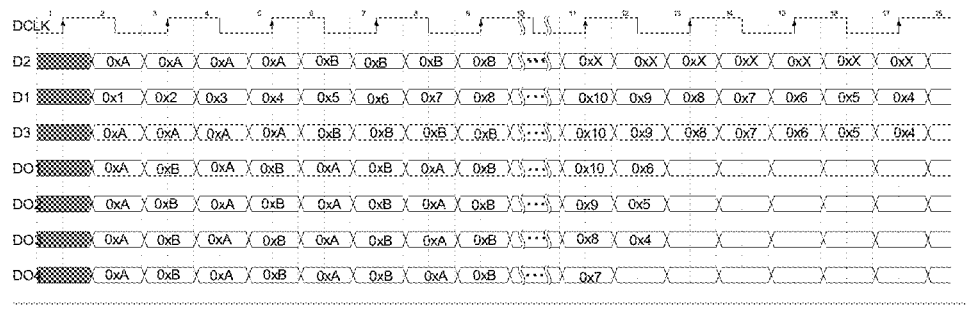
FIG. 10 shows a timing chart of transmission of ADC sampling data according to another specific embodiment of the present disclosure.

FIG. 10 is a transmission timing relationship chart of ADC alternating time parallel sampling data having 8 code patterns of AAAABBBB as preambles. As shown in FIG. 10, this timing relationship chart explains how the present disclosure determines the data synchronization status of each time interleaved ADC.

It can be seen from FIG. 8 that the serial data D3 is decoded to recover the four channels of parallel data DO1, DO2, DO3 and DO4 during the decoding process of the decoding device. The parsing rule of this step is to output the serial data D3 to DO1~DO4 in sequence, that is, the first serial data belongs to DO1, the second serial data belongs to DO2, . . . . Since a fixed preamble code pattern and a prescribed parsing algorithm are used, it can be known that, if the four channels of parallel data are correctly parsed herein, they should all begin with an AB code pattern, and the beginnings of the four channels of data are exactly the same (i.e., DO1, DO2, DO3, DO4 in FIG. 10). If the beginnings of the four channels of data are different in practical, it means that the four ADC data are not synchronized successfully.

Those skilled in the art should understand that the embodiments of the present application can be provided as a method, a system, or a computer program product. Therefore, the application can take the form of an entirely hardware embodiment, an entirely software embodiment or an embodiment combining software and hardware aspects. Moreover, this application can take the form of a computer program product that is carried out on one or more computer usable storage media (including but not limit to disk memory, CD-ROM, optical memory and etc.) containing computer usable program code therein.

This application is described with reference to flowcharts and/or block diagrams of methods, devices (systems) and computer program products according to the embodiments of the present disclosure. It should be understood that each flow and/or block of the flowcharts and/or block diagrams as well as the combination of the flow and/or block of the flowcharts and/or block diagrams can be achieved via computer program instructions. Such computer program instructions can be provided to a general purpose computer, a special purpose computer, an embedded processor or any other processor of a programmable data processing device to generate a machine, such that a device for implementing the functions as specified in one or more flows of a flowchart and/or one or more blocks of a block diagram can be produced via instructions executed by a processor in a computer or other programmable data processing device.

Such computer program instructions may also be stored in a computer readable memory which can direct a computer or other programmable data processing apparatus to function in a particular manner, such that the instructions stored in the computer readable memory can produce an article of manufacture including an instruction device; such instruction device can achieve the functions specified in one or more flows of a flow chart and/or one or more blocks of a block diagram.

Such computer program instructions may also be loaded onto a computer or other programmable data processing apparatus to cause a series of operational steps being performed on the computer or other programmable apparatus to produce a computer implemented process such that the instructions that execute on the computer or other programmable apparatus can provide steps for implementing the functions specified in one or more flows of a flow chart and/or one or more blocks of a block diagram.

The above is only used to illustrate the technical solutions of the present application, and any person of ordinary skill in the art can modify and change the foregoing embodiments without departing from the spirit and scope of the present application. Therefore, the protection scope of this application shall be subject to the scope of the claims.

What is claimed is:

1. An ADC sampling data identification method, wherein the ADC sampling data identification method, which is applicable to an ADC integrated circuit, comprises:
    converting sampling data from n time interleaved ADC chips into serial data;
    generating a preamble sequence;
    combining the serial data with the generated preamble sequence to obtain new serial data, and sending the new serial data to a decoding device;
    generating a clock signal that matches the new serial data, and sending the clock signal to the decoding device for the decoding device to identify the sampling data according to the new serial data and the clock signal.

2. The ADC sampling data identification method according to claim 1, wherein the step of converting sampling data from n time interleaved ADC chips into serial data is performed before, after or simultaneously with the step of generating a preamble sequence.

3. The ADC sampling data identification method according to claim 1, wherein combining the serial data with the generated preamble sequence to obtain new serial data comprises:
    in case that the number of preambles in the preamble sequence is not defined when the preamble sequence is generated, intercepting the preambles in the preamble sequence by a predetermined number, and adding the intercepted preambles before the serial data or replacing a corresponding number of serial data with the intercepted preambles to obtain the new serial data;
    in case that the number of the preambles in the preamble sequence is defined when the preamble sequence is generated, adding the generated preamble sequence before the serial data or replacing the serial data with the generated preamble sequence to obtain the new serial data, or each time a preamble being generated, adding the generated preamble before the serial data or replacing the serial data with the generated preamble until a predetermined number of preambles being generated.

4. The ADC sampling data identification method according to claim 1, wherein rising edges and falling edges of the clock signal are aligned with centers of data units of the new serial data.

5. An ADC sampling data identification method, wherein the ADC sampling data identification method, which is applicable to a decoding device, comprises:
    receiving new serial data and a clock signal from an ADC integrated circuit, wherein the new serial data is composed of serial data and a preamble sequence, and wherein the serial data is converted from sampling data from n time interleaved ADC chips, and the clock signal matches the new serial data;
    obtaining the preamble sequence for combining according to an agreement with the ADC integrated circuit;
    identifying a start position of the sampling data from the time interleaved ADC chips according to the new serial data, the clock signal and the preamble sequence for combining.

6. The ADC sampling data identification method according to claim 5, wherein identifying a start position of the sampling data from the time interleaved ADC chips according to the new serial data, the clock signal and the preamble sequence for combining comprises:
    using the clock signal to parse the new serial data;
    comparing parsed data units with data units contained in the preamble sequence for combining, and in case that the parsed data units are identical to the data units contained in the preamble sequence for combining, determining that next parsed data unit is the start position of the sampling data from the time interleaved ADC chips.

7. The ADC sampling data identification method according to claim 5, further comprising:
    identifying if the sampling data of the time interleaved ADC chips is successfully synchronized according to the new serial data, the clock signal and the preamble sequence for combining.

8. The ADC sampling data identification method according to claim 7, wherein identifying if the sampling data of the time interleaved ADC chips is successfully synchronized according to the new serial data, the clock signal and the preamble sequence for combining comprises:
    using the clock signal to parse the new serial data;
    converting the parsed new serial data into n channels of parallel data;
    determining if first m data units in each channel of data meets a predetermined relationship with the preamble sequence, and if so, the data from the ADCs being successfully synchronized, wherein $$m \pounds \frac{N}{n},$$

N is the number of data units contained in the preamble sequence.

9. A time interleaved ADC sampling data identification system comprising:
an ADC integrated circuit and
a decoding device;
wherein the ADC integrated circuit includes n time interleaved ADC chips and further includes:
a parallel-serial conversion module which is configured to convert sampling data from the n time interleaved ADC chips into serial data;
a preamble generating module which is configured to generate a preamble sequence;
a combination module which is configured to combine the serial data with the generated preamble sequence to obtain new serial data, and send the new serial data to a decoding device;
a matching clock generating module which is configured to generate a clock signal that matches the new serial data, and send the clock signal to the decoding device for the decoding device to identify the sampling data according to the new serial data and the clock signal; and wherein the decoding device includes:
a communication module which is configured to receive new serial data and a clock signal from an ADC integrated circuit, wherein the new serial data is composed of serial data and a preamble sequence, and wherein the serial data is converted from sampling data from n time interleaved ADC chips, and the clock signal matches the new serial data;
a preamble module which is configured to obtain the preamble sequence for combining according to an agreement with the ADC integrated circuit;
a start position identification module which is configured to identify a start position of the sampling data from the time interleaved ADC chips according to the new serial data, the clock signal and the preamble sequence for combining.

10. The time interleaved ADC sampling data identification system according to claim 9, wherein the combination module combining the serial data with the preamble sequence to obtain the new serial data comprises:
in case that the number of preambles in the preamble sequence is not defined when the preamble sequence is generated, intercepting the preambles in the preamble sequence by a predetermined number, and adding the intercepted preambles before the serial data or replacing a corresponding number of serial data with the intercepted preambles to obtain the new serial data;
in case that the number of the preambles in the preamble sequence is defined when the preamble sequence is generated, adding the generated preamble sequence before the serial data or replacing the serial data with the generated preamble sequence to obtain the new serial data, or each time a preamble being generated, adding the generated preamble before the serial data or replacing the serial data with the generated preamble until a predetermined number of preambles being generated.

11. The time interleaved ADC sampling data identification system according to claim 10, wherein rising edges and falling edges of the clock signal generated by the matching clock generating module are aligned with centers of data units of the new serial data.

12. The time interleaved ADC sampling data identification system according to claim 9, wherein the start position identification module identifying a start position of the sampling data from the time interleaved ADC chips according to the new serial data, the clock signal and the preamble sequence for combining comprises:
using the clock signal to parse the new serial data;
comparing parsed data units with data units contained in the preamble sequence for combining, and in case that the parsed data units are identical to the data units contained in the preamble sequence for combining, determining that next parsed data unit is the start position of the sampling data from the time interleaved ADC chips.

13. The time interleaved ADC sampling data identification system according to claim 12, further comprising:
a synchronization status identification module which is configured to identify if the sampling data of the time interleaved ADC chips is successfully synchronized according to the new serial data, the clock signal and the preamble sequence for combining.

14. The time interleaved ADC sampling data identification system according to claim 13, wherein the synchronization status identification module identifying if the sampling data of the time interleaved ADC chips is successfully synchronized according to the new serial data, the clock signal and the preamble sequence for combining comprises:
using the clock signal to parse the new serial data;
converting the new serial data into n channels of parallel data;
determining if first m data units in each channel of data meets a predetermined relationship with the preamble sequence, and if so, the data from the ADCs being successfully synchronized, wherein $$m \pounds \frac{N}{n},$$

N is the number of data units contained in the preamble sequence.

* * * * *